United States Patent [19]
Shacter et al.

[11] Patent Number: 5,659,266
[45] Date of Patent: Aug. 19, 1997

[54] LOW VOLATAGE OUTPUT STAGE WITH IMPROVED OUTPUT DRIVE

[75] Inventors: Stuart Barnett Shacter; David Kunst, both of Tucson, Ariz.

[73] Assignee: National Semiconductor Corporation, Santa Clara, Calif.

[21] Appl. No.: 587,086

[22] Filed: Jan. 16, 1996

[51] Int. Cl.$^6$ .................................................. H03F 3/30
[52] U.S. Cl. ..................................... 330/267; 330/263
[58] Field of Search ........................... 330/263, 267, 330/268

[56] References Cited

U.S. PATENT DOCUMENTS

| | | | |
|---|---|---|---|
| 4,570,128 | 2/1986 | Monticelli | 330/267 |
| 5,442,320 | 8/1995 | Kunst et al. | 330/267 |
| 5,444,419 | 8/1995 | Honda | 330/267 X |
| 5,521,553 | 5/1996 | Butler | 330/267 X |

OTHER PUBLICATIONS

Smith, Doug, Koen, Mike and Witulski, Arthur F., "Evolution of High-Speed Operational Amplifier Architectures", IEEE Journal of Solid-State Circuits, vol. 29, pp. 1166-1179, Oct. 1994.

*Primary Examiner*—James B. Mullins
*Attorney, Agent, or Firm*—Limbach & Limbach LLP

[57] ABSTRACT

A class AB low voltage output stage with improved current drive capability where the signal input to the stage modulates the base drive currents of both an output transistor sourcing current to a load and an output transistor sinking current from the load. Coupling the base drive currents by means of the input amplifier permits higher drive currents to be obtained for the output transistors without increasing the quiescent current of the circuit.

12 Claims, 4 Drawing Sheets

LOW VOLATAGE OUTPUT STAGE WITH IMPROVED OUTPUT DRIVE

FIELD OF THE INVENTION

The present invention relates to the output stages of analog semiconductor integrated circuits. It is desirable, in an amplifier output stage, to operate at low supply voltages, maintain a small and well controlled quiescent current, drive the output voltage close to both power supply rails, and have a large output current drive capability.

DESCRIPTION OF THE RELATED ART

An output stage that possesses many of the desirable characteristics described above is shown in U.S. Pat. No. 4,570,128 to Monticelli. Referring to FIG. 1, Monticelli describes a class AB output stage comprised of two large output transistors, a p-n-p transistor 10 that sources output current and an n-p-n transistor 11 that sinks load current, that are biased by means of current mirrors so that the bias is mainly controlled by the geometric ratios of the current mirror transistor elements. The output transistors 10, 11 are biased by means of unity gain common base drivers that provide the desired level shifting. The output voltage can be swung from close to the rail potential of the emitter of the n-p-n output transistor 11 to close to the rail potential of the emitter of the p-n-p output transistor 10. The circuit can drive relatively large load currents and can be fabricated using either CMOS or bipolar integrated circuits.

The FIG. 1 circuit can operate at supply voltages as low as twice the base-emitter threshold voltage for the transistors plus the emitter-collector saturation voltage ($2\ V_{be}+V_{sat}$), and can swing the output voltage within $V_{sat}$ of either power supply rail. The quiescent current is well controlled by selecting the values $I_1$ and $I_2$ of the bias current reference sources 24 and 26 and adjusting the area ratios of the various emitter sizes (i.e. adjusting the relative size of the transistors).

In the FIG. 1 circuit, the current references 24 and 26 source the same level of current, $I_1=I_2=I$. With the emitter area ratios shown in the diagram (e.g. the 4× next to transistor 6 in FIG. 1 indicates that the transistor has an emitter area that is 4 times as large as a unit transistor of minimum geometry for the fabrication technology utilized), the quiescent current equals $(6+N)I$, where N represents the ratio of emitter area of the output transistors to that of a unit transistor. This circuit, with p-n-p driver transistor 1, can source large currents because the output source transistor, transistor 10, is driven by an emitter follower, transistor 1. The circuit is limited, however, in the amount of current it can sink because of the limited current available to drive the base of the sink transistor, transistor 11.

If transistor 1 is not conducting at all (i.e. when the voltage at input 20 is within $2\ V_{be}$ of the positive supply voltage 28), the maximum current drive to transistor 11 is equal to the difference in current between transistors 6 and 9, ($I_6-I_9$). With the transistor ratios shown, this maximum drive current is 2 I. In this circuit configuration, the currents in transistor 6 and transistor 9 are constant so that even if the emitter areas or bias currents are adjusted, the available drive current to the sink transistor is always $I_6-I_9$. The only way to increase the drive current to get more output current is to increase the quiescent current of the overall circuit, which is an undesirable design characteristic.

SUMMARY OF THE INVENTION

The present invention increases the current sinking capacity of an output stage by making more current available to the base of the n-p-n output transistor, but without raising the overall quiescent current of the output stage. The input transistor of the output stage has its collector connected to a current sink that is part of the biasing circuitry for the output transistors such that, when the current in the input transistor decreases in response to the input voltage and causes the output stage to sink current, the current in the current sink will also decrease and, consequently, draw less of the quiescent biasing current away from the base of the n-p-n output transistor. The result is that the current that is not shunted away by the current sink is injected into the base of the n-p-n output transistor and the transistor sinks more load current.

BRIEF DESCRIPTION OF THE DRAWINGS

The features and advantages of the low voltage AB output stage with improved current sinking capacity according to the present invention will be more clearly understood from the following description taken in conjunction with the accompanying drawings in which.

DETAILED DESCRIPTION OF THE INVENTION

Figure 1:
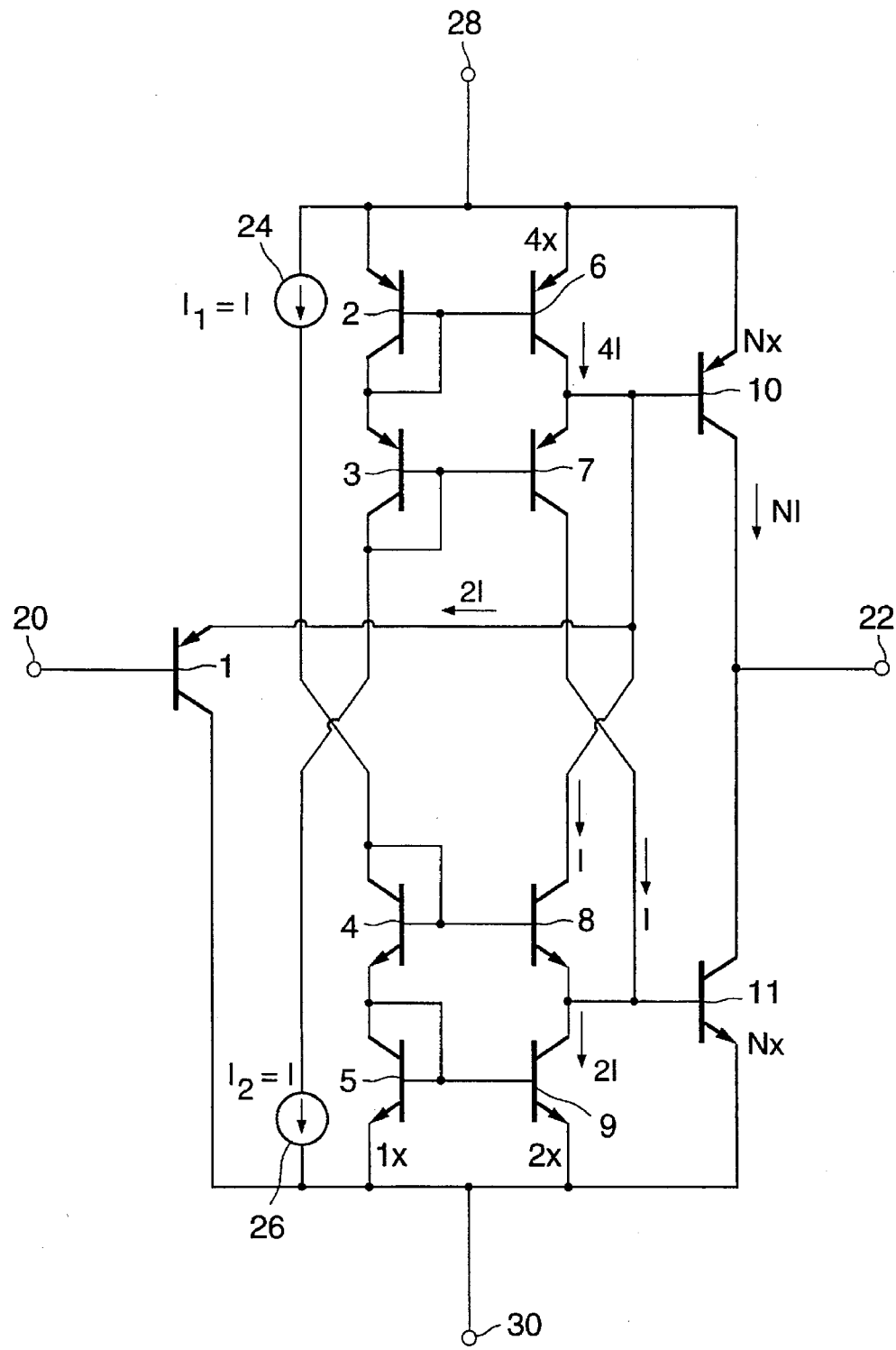
FIG. 1 is a simplified schematic diagram of a prior art output stage.
Figure 2A:
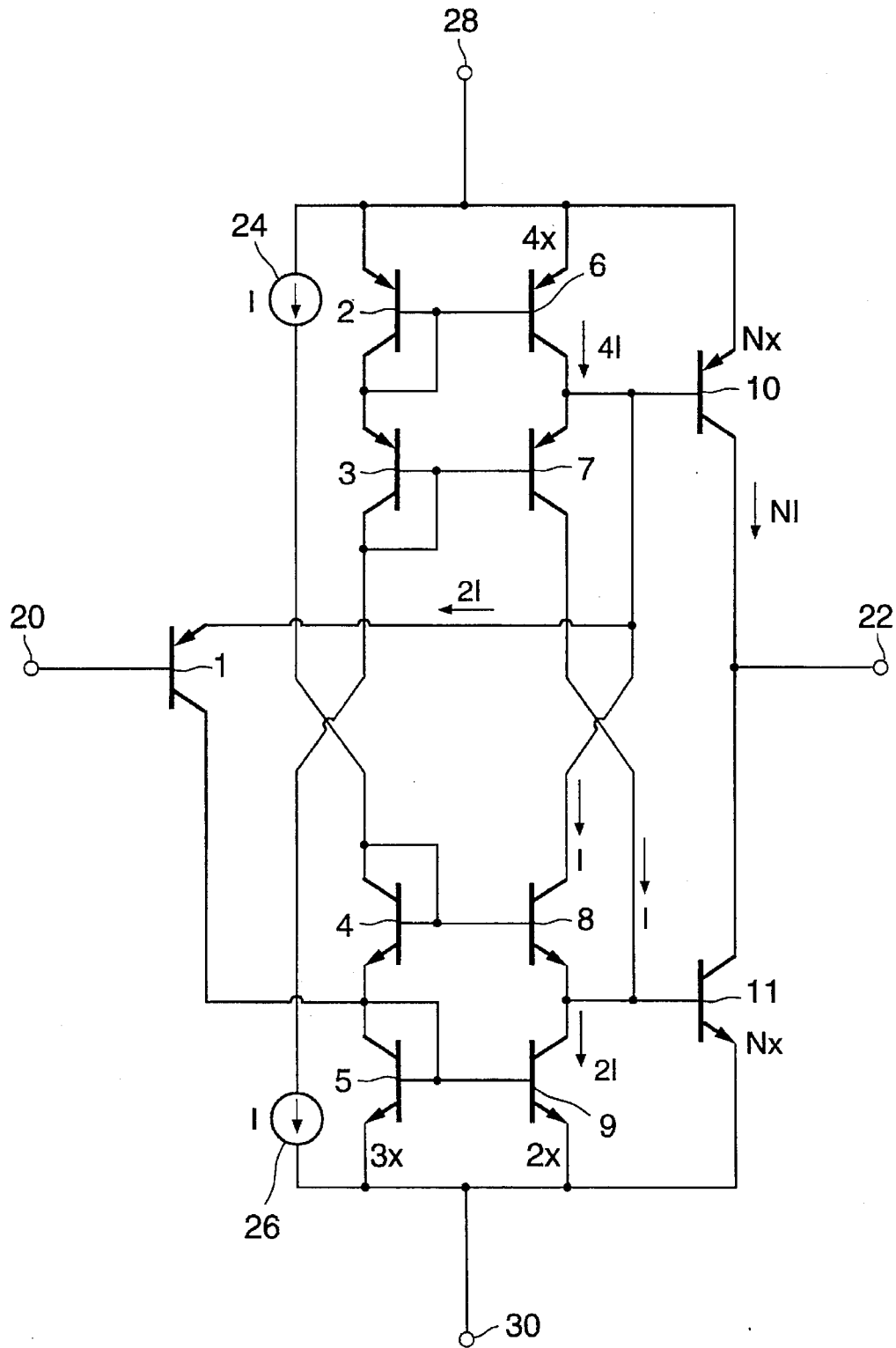
FIG. 2A and FIG. 2B are simplified schematic diagrams of a first and a second embodiment respectively of the output stage of the present invention.
Figure 2B:
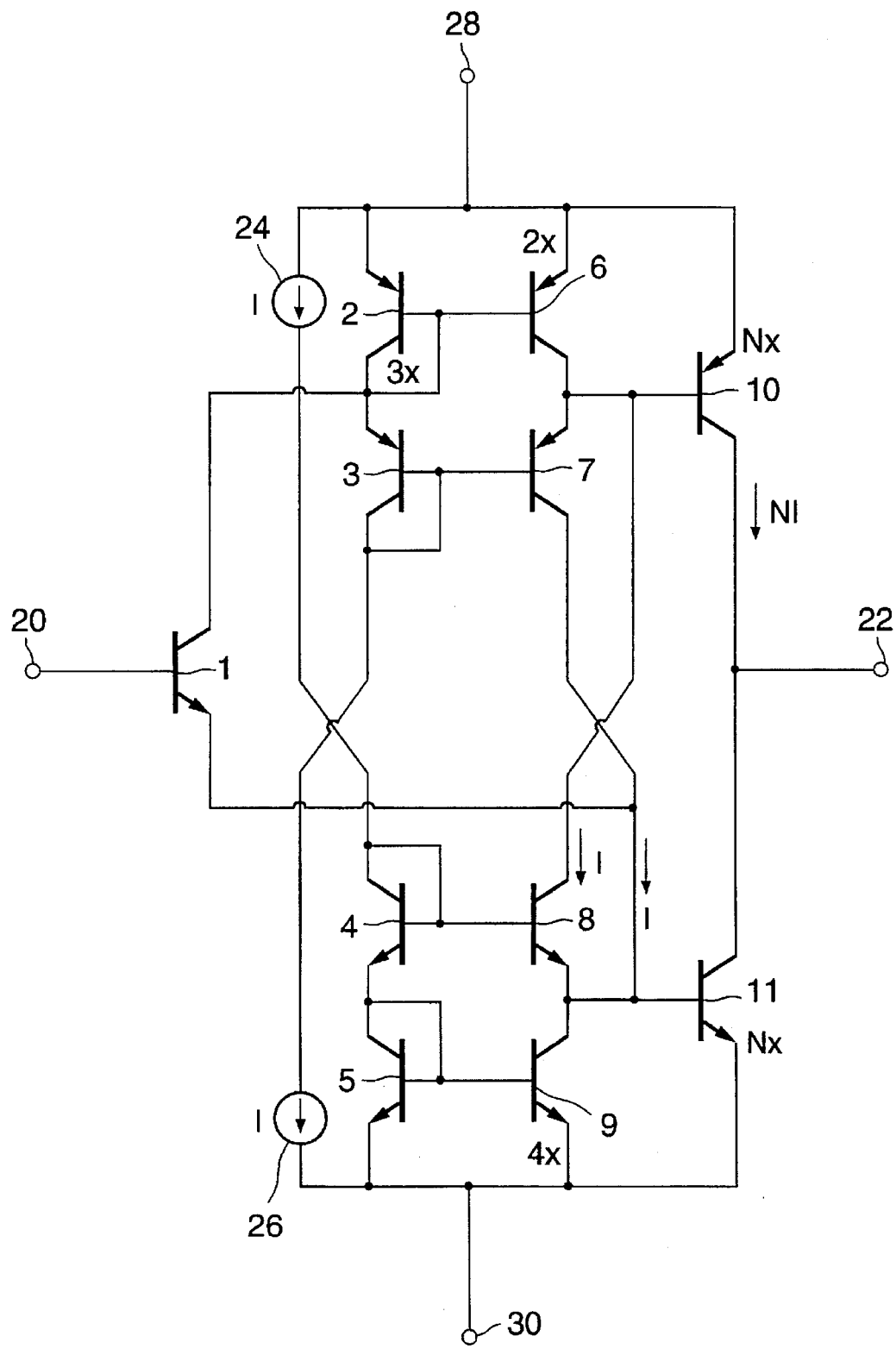
Figure 3:
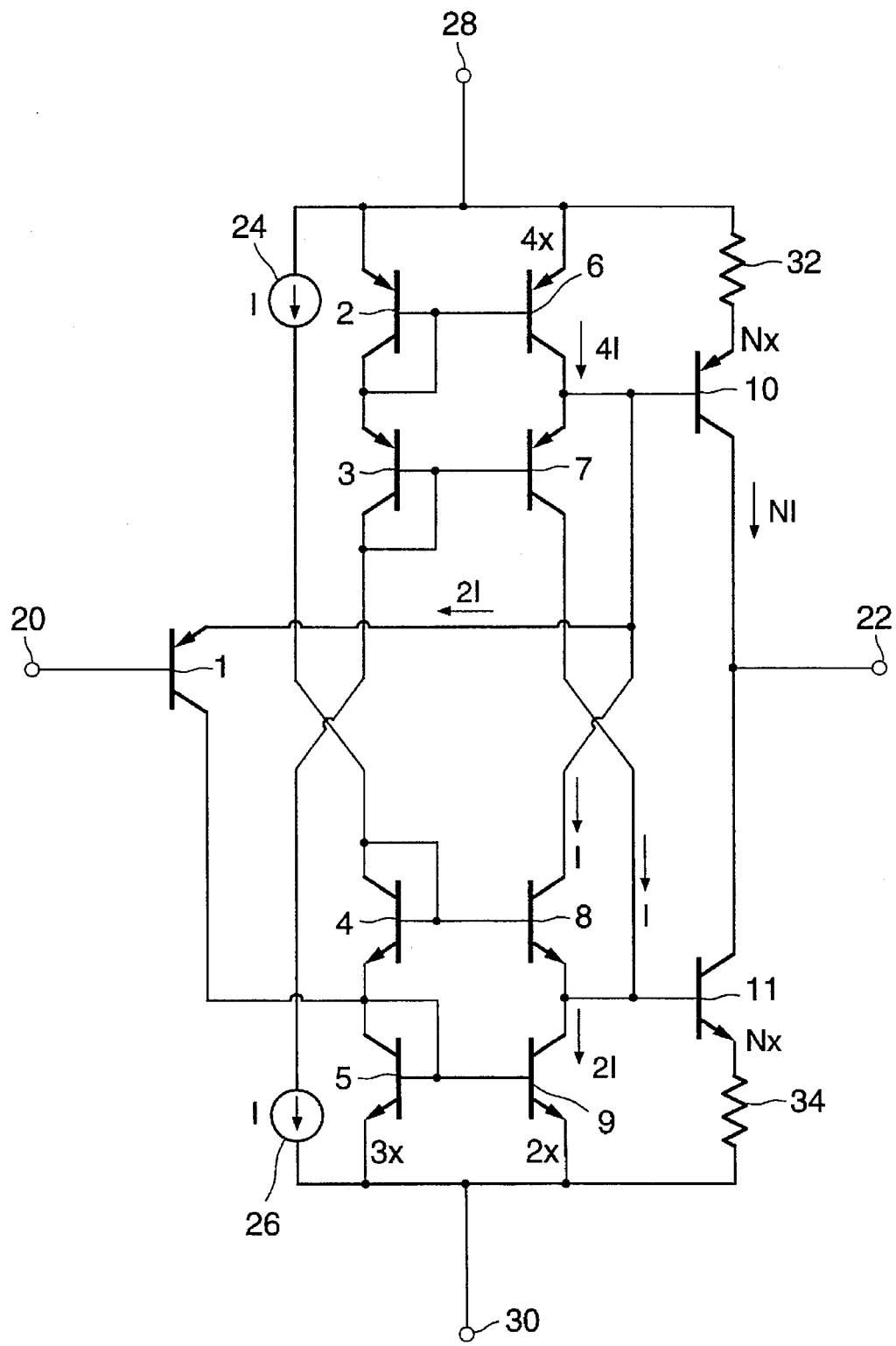
FIG. 3 is a simplified schematic diagram of a third embodiment of the output stage of the present invention.

FIG. 1 demonstrates an example of the prior art. FIGS. 2A, 2B and 3 illustrate embodiments of the present invention which improve upon the prior art circuit of FIG. 1. Where the embodiments in FIGS. 2A, 2B and 3 of the present invention have components that correspond to the prior art, the identical identifying number has been used.

In FIG. 2A, the circuit is operated from a power supply with the positive power connected to terminal 28 and the negative power connected to terminal 30. The output stage has an output terminal 22 that responds to the signal appearing at input terminal 20. A large area p-n-p output transistor 10 is coupled in series with a large area n-p-n transistor 11 so that both conduct the same quiescent current. In the embodiment shown, transistors 10 and 11 are N times the size of a unit transistor of minimal geometry.

The output transistors are scaled to have substantially the same gain and the proportional sizing of the transistors 10 and 11 determines the quiescent current of the transistors during operation. In this embodiment, the quiescent current in the output transistors is N times I (NI), where I is the magnitude of the current provided by current references 24 and 26.

As in the prior art, to obtain class AB output performance from the FIG. 2A circuit, the base-emitter voltage of output transistors 10 and 11 must equal or exceed one threshold voltage level, $V_{be}$, in order to bias the output transistors in their active region. To bias output transistor 10, current reference 26 sinks a current of magnitude I, in this embodiment, from series connected transistors 2 and 3. Transistor 2 is a current mirror that has its base connected to both its collector and the base of current source transistor 6. Transistor 3 also has its base connected to its collector which is, in turn, connected to the base of transistor 7 which has its emitter connected to the base of output transistor 10. When transistors 2 and 3 are operational, a voltage drop of $2\ V_{be}$ from the positive supply appears at the collector of transistor 3. Because the collector of transistor 3 is coupled through the base-emitter junction of transistor 7 to the base of transistor 10, the potential at the base of output transistor 10 is one threshold voltage below the potential of the emitter of transistor 10 and transistor 10 is biased in its active region.

Current reference 24 in series with transistors 4 and 5 serve to bias output transistor 11. When reference 24 sources current I to transistors 4 and 5, a potential that is two threshold voltages above the negative power supply appears at the base of transistor 4 which is connected to the base of transistor 8. The emitter of transistor 8 is connected to the base of transistor 11 and, as a result, the base-emitter voltage of output transistor 11 is one threshold voltage above the negative power supply connected to the emitter of transistor 11 and the transistor is biased in its active region.

Current source transistor 6 conducts current from the positive supply rail connected to terminal 28 to the base of output transistor 10. Current source 6 is biased in its active region by its current mirror base connection to transistor 2. In this embodiment, a current of magnitude I flows in transistor 2 by virtue of its series connection through transistor 3 to current reference 26. Because transistor 6 is four times the size of transistor 2, a constant current of 4 times I (4 I) is generated in transistor 6. The current sourced by transistor 6 is split between the base current of output transistor 10, the complementary transistors 7 and 8 connected between the bases of output transistors 10 and 11, and the input transistor 1.

Current sink transistor 9 is connected to the base of output transistor 11 from which it sinks the current from the emitter of transistor 8 and the collector of transistor 7. Current sink 9 is current mirror base connected to transistor 5 so that a quiescent current I sourced by current reference 24 biases transistor 9 in its active region and it sinks current from the base of output transistor 11.

In a departure from the prior art circuit shown in FIG. 1, however, the base of transistor 9 is also coupled to the base of output transistor 10 through input transistor 1. In the prior art, transistor 9 was a constant current sink sized such that input transistor 1 and transistor 9 were capable of sinking the quiescent current sourced by current source 6. As a consequence, transistor 9 continued to sink the same constant current when output transistor 11 was active and it was desirable to have a high drive current at the base of transistor 11.

By coupling the base of output transistor 10 to the base of current sink 9 through input transistor 1, the current from constant current source 6 is drawn away from the base of output transistor 10 and used to sink current away from the base of output transistor 11. Under small signal conditions, input transistor 1 modulates the current at the base of transistor 10 in response to a varying input signal at terminal 20. As the input signal potential decreases, the current in transistor 1 increases, drawing away the current sourced by transistor 6 and lowering the potential at the base of output transistor 10 causing it to source current to output terminal 22. The current diverted from the base of transistor 10 is conducted by transistor 1 to the base of current sink 9. The increased base current in transistor 9 results in a corresponding increase in the collector current of transistor 9 which sinks the quiescent current of transistors 7 and 8 and forces output transistor 11 towards cut-off.

Because input transistor 1 shunts current to the base of current sink transistor 9, the quiescent current of transistor 9 can be made smaller. As a result, when the input signal at terminal 20 rises causing input transistor 1 to conduct less current and, consequently, forcing output transistor 10 towards cut-off, more of the current sourced by constant current source 6 is available to drive output transistor 11.

The advantages are demonstrated by comparing the results obtained from the relative transistor sizes shown in FIGS. 1 and 2A. In the prior art example of FIG. 1, transistor 9 is twice the size of transistor 5 so as to induce a constant current sink of 2 I. Input transistor 1, when the input signal at terminal 20 has decreased sufficiently, will conduct a current of magnitude 2 I from the base of output transistor 10 to ground such that the current sourced by transistor 6 is shunted away from the base of output transistor 11 and no current flows in transistor 11. When the input signal at terminal 20 increases sufficiently to cut-off the flow of current in transistor 1, transistor 9 continues to sink 2 I and the maximum available drive current for output transistor 11 is the remaining 2 I available from transistor 6 that flows through transistors 7 and 8. The total quiescent current of the circuit of FIG. 1 is the 4 I from transistor 6, I from current reference 24, I from current reference 26 and the NI flowing through either of the output transistors 10 and 11 for a total $I_Q=(6+N)I$.

Using the proportions for the embodiment of the present invention shown in FIG. 2A, transistor 9 is twice the size of a unit transistor while transistor 5 is three times the size of a unit transistor. The result is that when transistor 5 is conducting a current of magnitude I as a result of series connection with current reference 24, transistor 9 will conduct a current of 0.67 I. When the input signal at terminal 20 decreases sufficiently, input transistor 1 will conduct a current of up to 2 I which appears at the base of transistor 9. The elevated base current from transistor 1 causes transistor 9 to sink the remaining 2 I of current from constant current source 6 and output transistor 11 is biased in its active region. Conversely, when the input signal at terminal 20 increases to the point that input transistor 1 is not conducting, transistor 9 only sinks its quiescent current of 0.67 I. The remaining current of 3.33 I from transistor 6 then drives the output transistor 11 resulting in greatly improved current sinking capacity for the circuit. The quiescent current for the circuit, however, remains $I_Q=(6+N)I$.

It is to be understood that while the input transistor 1 is shown in FIG. 2A as a p-n-p transistor coupling the base of output transistor 10 to the base of current sink 9 it could also be an n-p-n transistor, as shown in FIG. 2B, coupling the base of output transistor 11 to the base of current source 6. Also, the proportional transistor sizes and current reference values shown in FIGS. 2A and 2B and discussed above are illustrative and may be modified to obtain different quiescent circuit performance.

Furthermore, the emitters of output transistors 10 and 11 may be coupled to their respective power supply terminals through small degeneration resistors 32 and 34, as illustrated in FIG. 3. The voltage drop introduced with the degeneration resistors reduces the quiescent current drawn by the output transistors 10 and 11. The degeneration resistors are also useful for matching transistors with large area ratios, such as transistors 10 and 11.

What is claimed is:

1. A complementary bipolar transistor class AB output stage circuit having signal input and output terminals, the circuit comprising:

positive and negative supply terminals connectable to a source of operating power;

a p-n-p output transistor having an emitter coupled to the positive supply terminal, a collector coupled to the output terminal, and a base;

an n-p-n output transistor having an emitter coupled to the negative supply terminal, a collector coupled to the output terminal, and a base;

a p-n-p common base bias transistor having an emitter coupled to the base of the p-n-p output transistor, a collector coupled to the base of the n-p-n output transistor, and a base coupled to a source of bias voltage operated at about two $V_{be}$ below the positive supply terminal potential;

an n-p-n common base bias transistor having an emitter coupled to the base of the n-p-n output transistor, a collector coupled to the base of the p-n-p output transistor, and a base coupled to a source of bias voltage operated at about two $V_{be}$ above the negative supply terminal potential;

a current source coupled between the positive supply terminal and the base of the p-n-p output transistor;

a current sink coupled between the negative supply terminal and the base of the n-p-n output transistor; and means for simultaneously applying a signal to the base of one of the output transistors and to one of the current source and the current sink coupled to the other output transistor.

2. The circuit of claim 1, wherein the means for applying a signal comprise:

a bipolar emitter follower transistor stage.

3. The circuit of claim 1 wherein the emitter of the p-n-p output transistor is coupled to the positive supply terminal in series with a first degeneration resistor and the emitter of the n-p-n output transistor is coupled to the negative supply terminal in series with a second resistor.

4. A method for producing class AB output stage performance in a complementary bipolar transistor circuit having input and output terminals, positive and negative supply terminals connectable to a source of operating power, a p-n-p output transistor having an emitter coupled to the positive supply terminal and a collector coupled to the output terminal and a base, an n-p-n output transistor having an emitter coupled to the negative supply terminal and a collector coupled to the output terminal and a base, a p-n-p common base bias transistor having an emitter coupled to the base of the p-n-p output transistor and a collector coupled to the base of the n-p-n output transistor and a base coupled to a source of bias voltage operated below the positive supply terminal potential, an n-p-n common base bias transistor having an emitter coupled to the base of the n-p-n output transistor and a collector coupled to the base of the p-n-p output transistor and a base coupled to a source of bias voltage operated above the negative supply terminal potential, a current source coupled between the positive supply terminal and the base of the p-n-p output transistor, and a current sink coupled between the negative supply terminal and the base of the n-p-n output transistor comprising the steps of:

biasing the output transistors such that a quiescent current flows in the output transistors when no current flows in the output terminal; and simultaneously applying an input signal appearing at the input terminal to the base of one of the output transistors and to one of the current source and the current sink coupled to the other output transistor.

5. A complementary bipolar transistor class AB output stage circuit having signal input and output terminals, the circuit comprising:

positive and negative supply terminals connectable to a source of operating power;

a p-n-p output transistor having an emitter coupled to the positive supply terminal, a collector coupled to the output terminal, and a base;

an n-p-n output transistor having an emitter coupled to the negative supply terminal, a collector coupled to the output terminal, and a base;

a p-n-p common base bias transistor having an emitter coupled to the base of the p-n-p output transistor, a collector coupled to the base of the n-p-n output transistor, and a base coupled to a source of bias voltage operated at about two $V_{be}$ below the positive supply terminal potential;

an n-p-n common base bias transistor having an emitter coupled to the base of the n-p-n output transistor, a collector coupled to the base of the p-n-p output transistor, and a base coupled to a source of bias voltage operated at about two $V_{be}$ above the negative supply terminal potential;

a current source coupled between the positive supply terminal and the base of the p-n-p output transistor, wherein the current source forms a first current mirror with a first p-n-p current transistor having its collector directly coupled to its base;

a current sink coupled between the negative supply terminal and the base of the n-p-n output transistor, wherein the current sink forms a second current mirror with a first n-p-n current transistor having its collector directly coupled to its base; and a bipolar emitter follower transistor stage for simultaneously applying a signal to the base of one of the output transistors and to one of the current source and the current sink coupled to the other output transistor.

6. The circuit of claim 5 wherein the first p-n-p current transistor is coupled in series with a second p-n-p current transistor to develop a potential about two $V_{be}$ below the positive supply terminal potential and a second n-p-n current transistor is coupled in series with the first n-p-n current transistor to develop a potential about two $V_{be}$ above the negative supply terminal potential.

7. The circuit of claim 6 wherein:

the means for applying a signal is a p-n-p input transistor with its emitter connected to the base of the p-n-p output transistor and the signal is applied to the base of the input transistor; and the current sink is an n-p-n transistor with its collector connected to the base of the n-p-n output transistor, its emitter connected to the negative supply terminal potential and its base connected to the collector of the input transistor.

8. The circuit of claim 7 wherein the current source is a p-n-p transistor that is four times a unit size, the first p-n-p current transistor is one unit size, the current sink is two unit sizes, the first n-p-n current transistor is 3 unit sizes, the p-n-p common base bias transistor is one unit size and the n-p-n common base bias transistor is one unit size.

9. The circuit of claim 8 wherein the unit size is that of a minimum geometry transistor.

10. The circuit of claim 6 wherein the means for applying a signal is an n-p-n input transistor with its emitter connected to the base of the n-p-n output transistor and the signal is applied to the base of the input transistor; and the current source is a p-n-p transistor with its collector connected to the base of the p-n-p output transistor, its emitter connected to the positive supply terminal potential and its base connected to the collector of the input transistor.

11. The circuit of claim 10 wherein the current sink is a n-p-n transistor that is four times a unit size, the first n-p-n current transistor is one unit size, the current source is two unit sizes, the first p-n-p current transistor is 3 unit sizes, the p-n-p common base bias transistor is one unit size and the n-p-n common base bias transistor is one unit size.

12. The circuit of claim 11 wherein the unit size is that of a minimum geometry transistor.

* * * * *

UNITED STATES PATENT AND TRADEMARK OFFICE
CERTIFICATE OF CORRECTION

PATENT NO. : 5,659,266
DATED : August 19, 1997
INVENTOR(S) : Stuart Barnett Shacter et al.

It is certified that error appears in the above-identified patent and that said Letters Patent is hereby corrected as shown below:

On the title page, item [54] and column 1, line 2, "VOLATAGE" should read --VOLTAGE--.

Signed and Sealed this

Twenty-third Day of December, 1997

Attest:

BRUCE LEHMAN

Attesting Officer

Commissioner of Patents and Trademarks